US008845867B2

(12) United States Patent
Hara et al.

(10) Patent No.: US 8,845,867 B2
(45) Date of Patent: Sep. 30, 2014

(54) METHOD FOR MANUFACTURING MAGNETORESISTANCE EFFECT ELEMENT USING SIMULTANEOUS SPUTTERING OF ZN AND ZNO

(75) Inventors: Shinji Hara, Tokyo (JP); Yoshihiro Tsuchiya, Tokyo (JP); Tsutomu Chou, Tokyo (JP); Tomihito Mizuno, Tokyo (JP)

(73) Assignee: TDK Corporation, Tokyo (JP)

( * ) Notice: Subject to any disclaimer, the term of this patent is extended or adjusted under 35 U.S.C. 154(b) by 1164 days.

(21) Appl. No.: 12/314,346

(22) Filed: Dec. 9, 2008

(65) Prior Publication Data

US 2010/0142098 A1 Jun. 10, 2010

(51) Int. Cl.
| | |
|---|---|
| C23C 14/34 | (2006.01) |
| C23C 14/00 | (2006.01) |
| G01R 33/09 | (2006.01) |
| B82Y 25/00 | (2011.01) |
| G11B 5/39 | (2006.01) |

(52) U.S. Cl.
CPC .......... *G11B 5/3912* (2013.01); *C23C 14/0036* (2013.01); *G01R 33/093* (2013.01); *B82Y 25/00* (2013.01); *C23C 14/3464* (2013.01)
USPC .................................. 204/192.2; 204/192.18

(58) Field of Classification Search
USPC ............... 204/192.2, 192.26, 192.15, 192.29, 204/192.18
See application file for complete search history.

(56) References Cited

U.S. PATENT DOCUMENTS

| | | | | |
|---|---|---|---|---|
| 4,640,756 A | * | 2/1987 | Wang et al. .............. | 204/192.18 |
| 5,567,523 A | * | 10/1996 | Rosenblum et al. .......... | 428/408 |
| 5,831,944 A | * | 11/1998 | Nishimura ................. | 369/13.42 |
| 6,205,092 B1 | * | 3/2001 | Yamaguchi et al. ........ | 369/13.14 |
| 6,398,925 B1 | * | 6/2002 | Arbab et al. ............. | 204/192.22 |
| 6,939,445 B2 | * | 9/2005 | Berger et al. ............. | 204/192.16 |
| 8,031,441 B2 | * | 10/2011 | Zhang et al. ............... | 360/324.1 |
| 2001/0008157 A1 | * | 7/2001 | Bishop et al. ................. | 148/678 |
| 2008/0118661 A1 | * | 5/2008 | Watanabe et al. ............. | 427/576 |

FOREIGN PATENT DOCUMENTS

| | | |
|---|---|---|
| JP | A-7-135440 | 5/1995 |
| JP | A-2001-279437 | 10/2001 |
| JP | A-2002-068889 | 3/2002 |

(Continued)

OTHER PUBLICATIONS

Translation to Inoue JP 2004-030934 published Jan. 2004.*

(Continued)

*Primary Examiner* — John Brayton
(74) *Attorney, Agent, or Firm* — Posz Law Group, PLC

(57) ABSTRACT

A method of manufacturing a magnetoresistive (MR) effective element having a pair of magnetic layers and a nonmagnetic intermediate layer including a ZnO film, wherein a relative angle of magnetization directions of the pair of magnetic layers varies according to an external magnetic field. The method includes a step for introducing a mix gas of oxygen gas and argon gas into a depressurized chamber, wherein a first target of ZnO, a second target of Zn and a substrate having a right-below layer are disposed in the chamber, and a step for depositing the ZnO film on the right-below layer by applying each of a first and second direct current (DC) application power to spaces between the first and second targets and the substrate respectively after the mix gas introducing step, wherein the first and second targets are set at negative potential, and the substrate is set at positive potential.

6 Claims, 8 Drawing Sheets

(56) References Cited

FOREIGN PATENT DOCUMENTS

| JP | 2004030934 A | * | 1/2004 |
| JP | A-2007-220820 | | 8/2007 |
| JP | A-2008-060202 | | 3/2008 |
| JP | A-2008-091842 | | 4/2008 |

OTHER PUBLICATIONS

Aita, et al., "The effect of $O_2$ on reactively sputtered zinc oxide," *J. Appl. Phys.*, vol. 51 (10), Oct. 1980, pp. 5533-5536.

* cited by examiner

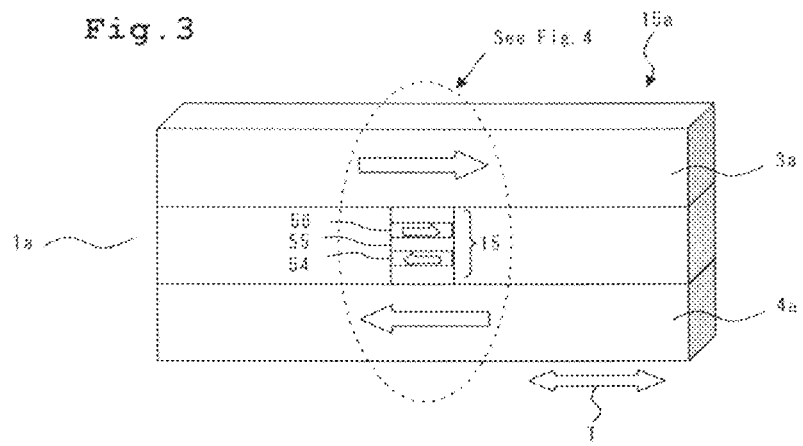
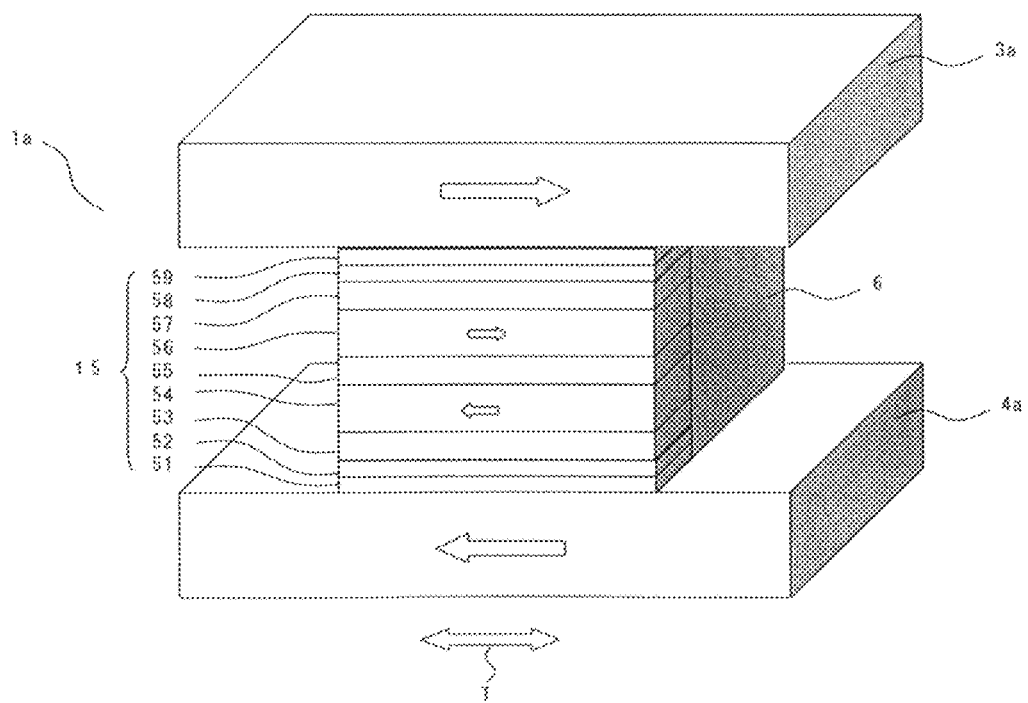

METHOD FOR MANUFACTURING MAGNETORESISTANCE EFFECT ELEMENT USING SIMULTANEOUS SPUTTERING OF ZN AND ZNO

BACKGROUND OF THE INVENTION

1. Field of the Invention

The present invention is related to a method for manufacturing a magnetoresistive (MR) effect element and to the MR effect element manufactured by the method. Also, the present invention is related to a method for forming a zinc oxide (ZnO) film.

2. Description of the Related Art

Zinc oxide (ZnO) is an important material that is used in various fields. For example, ZnO has been widely used in cosmetics to take advantage of its ultraviolet ray absorbing function, as a vulcanization accelerator of rubber, and in electric components such as a gas sensor and a varistor. In recent years, it has attracted attention as a transparent electrode film as an alternative to Sn doping $In_2O_3$ (ITO). As a transparent electrode film, ZnO has been already used for a white light emitting diode, a touch panel, a thin-type display device and a solar battery, and its use has been rapidly increasing. Furthermore, it is discussed that ZnO has a potential as an alternative to expensive GaN-system materials as an illuminator of a blue/violet light emitting diode.

It is known that ZnO, which is widely used as functional material as described above, can be used as a nonmagnetic intermediate layer of an MR effect element (for example, see Japanese laid-open application No. 2008-91842). Hereafter, the thin-film head technology using the ZnO film for the nonmagnetic intermediate layer is described.

As the density of hard disk drives increases, the performance of thin film magnetic heads is required to be improved. As a thin film head, a composite-type thin film magnetic head is widely used. In the magnetic head, an MR effect element for reading and an induction electromagnetic conversion element for writing are layered.

Generally, for an MR effect element, a shield layer is built for eliminating effects of magnetic fields from any parts other than target bits for reading in a recording medium as much as possible. The current mainstream technology is a current perpendicular to the plane (CPP) structure in which a pair of shield layers and an MR effect element are connected electrically in series via a metal film. It is said that the CPP structure will inevitably achieve a recording density of 500 Gbits/in$^2$ or more.

The MR effect element of the CPP structure includes a pair of magnetic layers and a nonmagnetic intermediate layer sandwiched between the pair of magnetic layers. The MR effect element is configured to run a sense current in a direction perpendicular to film surfaces of the pair of magnetic layers and the nonmagnetic intermediate layer. One of the pair of magnetic layers is a magnetic free layer whose magnetizing direction can be changed according to an external magnetic field, and the other is a magnetic pinned layer whose magnetizing direction is fixed to the external magnetic field. In a situation without an external magnetic field, the magnetizing direction of the magnetic free layer is orthogonal in the magnetizing direction of a magnetic pinned layer by a bias magnetic field; however, the magnetizing direction of the magnetizing free layer rotates when an external magnetic field is applied. As the result, corresponding to a relative angle of the magnetizing direction, spin-dependent scattering of conduction electrons forming the sense current varies, and a change of magnetoresistance occurs. This change of the magnetoresistance is detected, and magnetic information of the recording medium is read.

Since the shield layers and the MR effect element are connected via metal films, the CPP structure has large radiation efficiency, and since the CPP structure structurally has low resistance, a large sense current can flow. These features indicate that the CPP structure is suitable for increasing resistant value and resistance change volume by decreasing its cross section. Namely, the MR effect element of the CPP structure has an advantage that is suitable for narrowing track width.

However, the MR effect element of the conventional CPP structure has merely a small magnetoresistive change rate (MR rate) so that the output is insufficient for practical use. Specifically, in practical use of a head of 300 Gbpsi or more, it becomes difficult to maintain a signal/noise (S/N) ratio when the MR rate is small. One reason that the MR rate of the MR effect element is small is that small electric resistance copper (Cu) is used for the nonmagnetic intermediate layer. Therefore, it is discussed that ZnO, which is a semiconductor as mentioned above, is used for the nonmagnetic layer. It is disclosed in Japanese laid-open application No. 2008-91842 that an MR effect element using ZnO for the nonmagnetic intermediate layer shows a significantly high MR rate.

However, there is a drawback in the MR effect element using ZnO for the nonmagnetic intermediate layer. The drawback is a large diversion of element resistances and a MR rate. When the diversion is large, a yield of the magnetic head that meets a required output performance is deteriorated, resulting in low manufacturing efficiency.

An object of the present invention is to provide the MR effect element that uses ZnO for the nonmagnetic intermediate layer and that suppresses diversions of an element resistance and MR rate, and a manufacturing method for the same. Further, the other object of the present invention is to provide a manufacturing method of a ZnO film that is useful for manufacturing the MR effect element and that is applicable to other technical fields.

SUMMARY OF THE INVENTION

According to one embodiment of the present invention, a method of manufacturing an MR effective element is disclosed, wherein the MR effective element has a pair of magnetic layers and a nonmagnetic intermediate layer including a Zinc Oxide (ZnO) film and that is sandwiched by the pair of the magnetic layers, a relative angle of magnetization directions of the pair of magnetic layers varies because at least the magnetization direction of one of the pair of the magnetic layers varies according to an external magnetic field.

The method of manufacturing includes step for introducing a mix gas of oxygen gas and argon gas into a depressurized chamber, wherein a first target of ZnO, a second target of Zn and a substrate having a right-below layer on which a ZnO film is to be formed are disposed in the chamber, the first and second targets are configured to face the right-below layer; and step for depositing the ZnO film on the right-below layer by applying each of a first and second direct current (DC) application power to spaces between the first and second targets and the substrate respectively after the mix gas introducing step, wherein the first and second targets are set at negative potential, and the substrate is set at positive potential.

It is known that a ZnO film shows extremely strong polarity. Therefore, in a film forming method, a ZnO film is formed with a c-axis orientation. C-axis orientation means that the c-axis is oriented in a direction perpendicular to a film surface of the ZnO film. In particular, it means that only either zinc elements or oxygen elements are formed on the outermost surface. These surfaces are respectively referred to as a zinc polarity surface and an oxygen polarity surface. However, which polarity surfaces appear on the outermost surface depends on a thickness of a ZnO film and other factors, that are difficult to control. One layer of the pair of the magnetic layers is formed on the ZnO film, and one layer of the pair is disposed on the ZnO film directly or via other metal layers. It is believed that inventor of the present application thinks that various properties of the MR effect element are affected by which polarity surface appears on the outermost surface, and this causes diversions of the MR rate and so on. In other words, it was inferred that an interfacial situation between the ZnO film and an adjacent layer formed directly on the film affects the properties of the MR element.

The inventor of the present application found that, by performing simultaneous sputtering using the first target made by ZnO and the second target made by zinc in a mixture (mix gas) of oxygen gas and argon gas, c-axis orientation of a ZnO film is restrained (or avoided) and an amorphous structure or a structure having an orientation other than a c-axis orientation can be obtained. As a result, zinc elements and oxygen elements coexist on the interface between the ZnO film and the adjacent layer so that it becomes possible to dramatically decrease a diversion of properties.

According to another embodiment of the present invention, an MR effect element includes a pair of magnetic layers and a nonmagnetic intermediate layer that includes a ZnO film and that is sandwiched by the pair of the magnetic layers, wherein a relative angle of magnetization direction of the pair of the magnetic layers varies because at least the magnetization direction of one of the pair of magnetic layers according to the external magnetic field, the ZnO film is configured so that its c-axis is angled with respect to an in-plane direction of the ZnO film.

According to another embodiment of the present invention, a method of forming a ZnO film includes step for arranging a first target of ZnO, a second target of Zn, and a deposition object having a deposition surface, wherein the first and second targets are arranged to face the deposition surface in a depressurized chamber; step for introducing a mix gas of oxygen gas and argon gas into the depressurized chamber; step for depositing a ZnO film on the deposition surface by applying each of first and second direct current (DC) application power to spaces between the first and second targets and the deposition object respectively after the mix gas introducing step, wherein the first and second targets are set at negative potential, and the deposition object is set at positive potential.

The above objectives, as well as other objectives, characteristics and advantages of the present invention will be clear according to descriptions below referring to the attached drawings where the present invention is illustrated.

BRIEF DESCRIPTION OF THE DRAWINGS

FIG. 3 is a perspective view of the MR effect element viewed from a side of the ABS of a thin film magnetic head relating to the second embodiment.

FIG. 4 is a partially enlarged perspective view of FIG. 3.

DETAILED DESCRIPTION OF THE INVENTION

Various examples of an MR effect element, which is the subject matter of this invention, as applied to the thin film magnetic head for a hard disk device will be described with reference to the charts.

Figure 1:
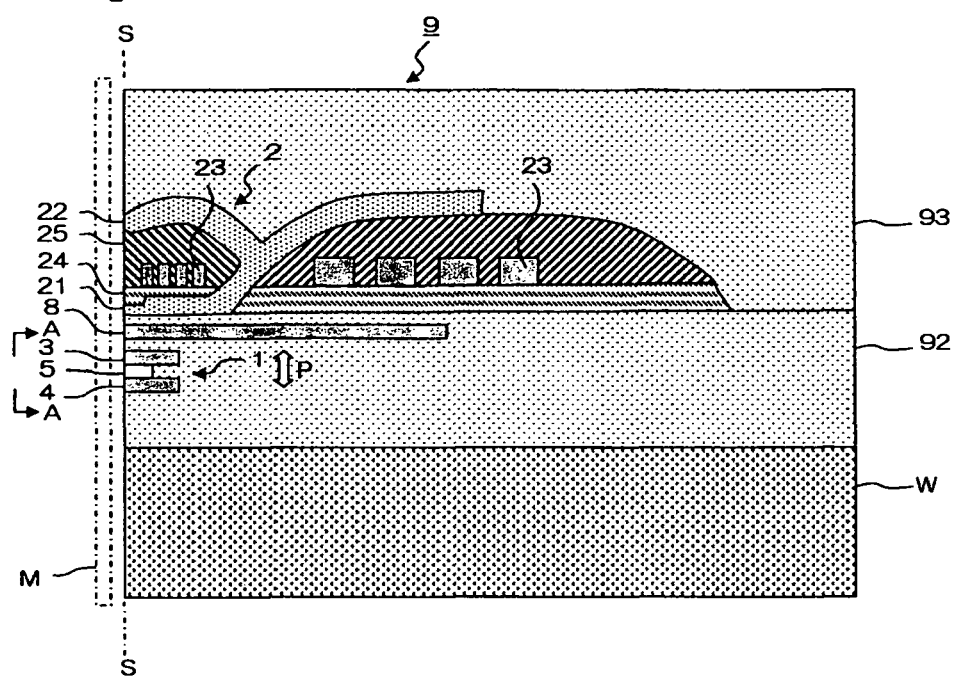
FIG. 1 is a main part sectional view of a thin film magnetic head relating to the first embodiment.
Figure 2:
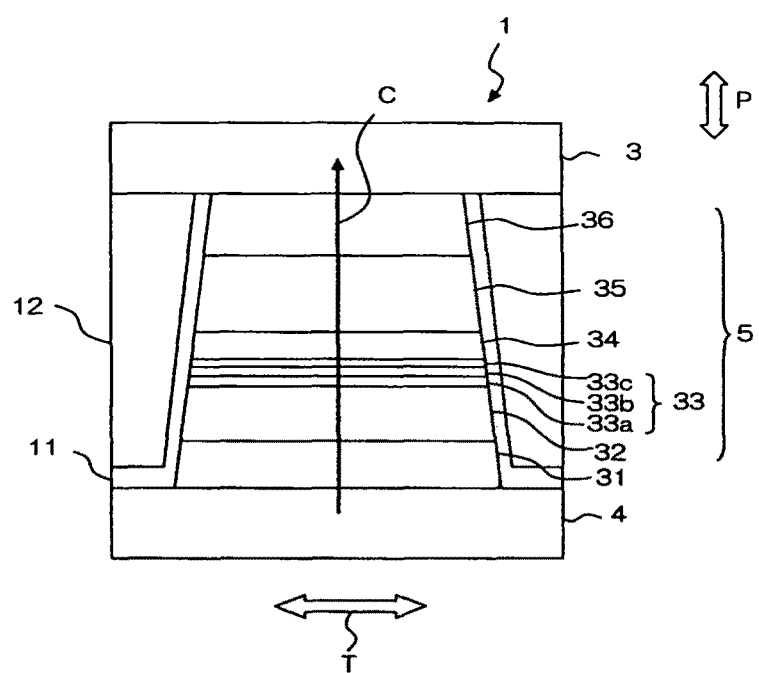
FIG. 2 is a side view of the MR effect element viewed from a direction of A-A of FIG. 1; that is, a medium facing surface (or air bearing surface ABS) S.

(First Embodiment) FIG. 1 is a main part sectional view of such a thin film magnetic head. FIG. 2 is a side view of the MR effect element viewed from a direction of A-A of FIG. 1; that is, the ABS S. The ABS S is a surface on which a thin film magnetic head 9 faces a recording medium M.

The thin film magnetic head 9 has an MR effect element 1 forming a reading head, and a writing head 2, both of which are formed above a substrate W. Referring to FIG. 2, the MR effect element 1 has a magneto-resistive (MR) layered body 5 in which many layers are deposited, an upper shield electrode layer 3 and a lower shield electrode layer 4 that are formed in a manner of sandwiching the MR layered body 5 in a perpendicular direction relative to the film surfaces (layering direction) P. A tip section of the MR layered body 5, as shown in FIG. 1, is disposed on the ABS S in an exposed state. The MR layered body 5 is configured to run a sense current in the film surface perpendicular direction P due to a voltage applied between the upper shield electrode layer 3 and the lower shield electrode layer 4. A magnetic field of the recording medium M at the opposite position of the MR layered body 5 changes according to a rotation of the recording medium M. The changes of the magnetic field are detected as electric resistance changes based on the MR effect. The MR effect element 1 reads magnetic information written in the recording medium M using this principle.

Table 1 shows one example of a film configuration of the MR layered body 5. Table 1 lists layers from a buffer layer 31 that is adjacent to the lower shield electrode layer 4 to a cap layer 36 that is adjacent to the upper shield electrode layer 3 in the respective order from bottom to the top.

TABLE 1

| Layer configuration | | Composition | Film thickness (nm) |
|---|---|---|---|
| Cap layer 36 | | Ru | 2 |
| Magnetic free layer 35 | | CoFe | 4 |
| Spacer layer 34 | | ZnO | 1.6 |
| Magnetic pinned layer 33 | Internal magnetic pinned layer 33c | CoFe | 3.5 |
| | Middle layer 33b | Ru | 0.7 |
| | External magnetic pinned layer 33a | CoFe | 3 |

TABLE 1-continued

| Layer configuration | Composition | Film thickness (nm) |
|---|---|---|
| Antiferromagnetic layer 32 | IrMn | 5 |
| Buffer layer 31 | NiCr | 4 |

The MR layered body 5 has a film configuration in which the buffer layer 31, an antiferromagnetic layer 32, a magnetic pinned layer 33, a nonmagnetic spacer layer 34, a magnetic free layer 35, and a cap layer 36 on the lower electrode and shied 4 composed of a NiFe layer whose thickness is about 1-2 μm in the respective order. The magnetic pinned layer 33 is a magnetic layer whose magnetization direction is fixed/pinned with respect to an external magnetic field. The magnetic pinned layer 35 is a magnet layer whose magnetization direction is changed with respect to the external magnet field. The sense current C runs in the perpendicular direction relative to each film surface of the magnetic pinned layer 33, the spacer layer 34 and the magnetic free layer 35; that is, the film surface of the MR layered body. "Perpendicular direction" includes cases in which the direction of the sense current C is nearly perpendicular to the surface of the film as well as to cases in which the direction of the sense current C is exactly perpendicular to the film surface. The magnetization direction of the magnetic free layer 35 is oriented at a relative angle with respect to the magnetization direction of the magnetic pinned layer 33 corresponding to the external magnetic field, and the change of its magnetoresistance occurs by changing spin-dependent scattering of conduction electrons corresponding to the relative angle. The MR effect element 1 detects the change of the magnetoresistance, and reads magnetic information of the recording medium M.

The magnetic pinned layer 33 is formed as a so-called synthetic magnetic pinned layer. In other words, the magnetic pinned layer 33 includes an external magnetic pinned layer 33a, an internal magnetic pinned layer 33c formed closer to the spacer layer 34 than the external magnetic pinned layer 33a, and a middle layer 33b that is nonmagnetic and sandwiched between the external magnetic pinned layer 33a and the internal magnetic pinned layer 33c. The magnetization direction of the external magnetic pinned layer 33a is pinned by an exchange-coupling between the antiferromagnetic layer 32 and the external magnetic pinned layer 33a. The internal magnetic pinned layer 33c is antiferromagnetically combined with the external magnetically pinned layer 33a via the middle layer 33b, and the magnetization direction of the internal magnetic pinned layer 33c is strongly fixed. By adopting a synthetic magnetic pinned layer, the magnetic pinned layer 33 maintains a stable magnetized status, and effective magnetization of the magnetic pinned layer 33 is controlled as a whole.

The spacer layer 34 is formed as a single layer structure of a ZnO film (hereafter, described as ZnO film). Since an electric resistance of the MR effect element in the CPP structure is generally low, improvement of the MR rate is expected. However, a great MR rate can be realized by using a semi-conductor made of ZnO as the spacer layer 34. Instead of a single layer structure of the ZnO film, a layered structure of Cu/ZnO/Cu can be used as the spacer layer 34. Furthermore, in this specification, the description of A/B/C and so on indicates a layer configuration of a multilayer film. For example, A/B/C indicates the layers A, B, C are deposited in respective order from the bottom.

The magnetic free layer 35 is formed of a CoFe layer. The CoFe layer has high percentage of spin polarizability, and contributes to increase the MR rate. The magnetic free layer 35 can be formed as a layered structure of CoFe/NiFe. The NiFe layer is a soft magnetic layer and the NiFe layer controls a magnetostriction and increases sensitivity with respect to a change of the magnetic field due to its small coercivity.

A buffer layer 31 is formed to realize an excellent exchange-coupling between the antiferromagnetic layer 32 and the external magnetic pinned layer 33a. The cap layer 36 is formed to avoid retrograding each of the layered layers. On the cap layer 36, the upper shield electrode layer 3 is formed, which is an NiFe film whose thickness is approximately 1-2 μm.

On the sides of the MR effect element 1, hard bias films 12 are formed via foundation films, which are not shown, composed by an insulating film 11 and Cr, CrTi and so on. The hard bias films 12 are domain control films to make the magnetic free layer a single-domain. The insulating film 11 is formed of $Al_2O_3$, and the hard bias film 12 is formed of CoPt, CoCrPt and so on.

Referring to FIG. 1 again, a recording head 2 is formed via an interelement shield layer 8 formed by sputtering and so on the MR effect element 1. The recording head 2 has a so-called perpendicular magnetic recording structure. A magnetic pole layer for writing is composed of a main magnetic pole layer 21 and an auxiliary magnetic pole layer 22. These magnetic pole layers 21 and 22 are formed by a frame plating method and so on. The main magnetic pole layer 21 is formed of FeCo, and the main magnetic pole layer 21 is exposed in the substantially perpendicular direction of the ABS S on the ABS S. Around the main magnetic pole layer 21, the coil layer 23 extending over the gap layer 24 made of an insulating material is wound, and magnetic flux is directed to the main magnetic pole layer 21 by the coil layer 23. The coil layer 23 is formed by a frame plating method. This magnetic flux is led to the inside of the main magnetic pole layer 21, and is discharged from the ABS S toward the recording medium. The main magnetic pole layer 21 is narrowed not only in the perpendicular direction relative to the film surface P but also in the direction of a track width T (see FIGS. 2 and 3) near the ABS S, and generates a minute and strong magnetic field that meets the high record density requirement.

The auxiliary magnetic pole layer 22 is a magnetic layer that is magnetically coupled with the main magnetic pole layer 21. The auxiliary magnetic pole layer 22 is a magnetic pole layer whose width is in a range of approximately 0.01 μm—approximately 0.5 μm formed with an alloy made of any two or three of Ni, Fe and Co. The auxiliary magnetic pole layer 22 is branched from the main magnetic pole layer 21, and faces the main magnetic pole layer 21 via a gap layer 24 and a coil insulating layer 25 at the ABS S side. An end of the auxiliary magnetic pole layer 22 at the ABS S side forms a trailing shield part whose layer cross section is wider than other parts of the auxiliary magnetic pole layer 22. With the auxiliary magnetic pole layer 22, a more precipitous magnetic field gradient between the auxiliary magnetic pole layer 22 and the main magnetic pole layer 21 in the vicinity of the ABS S is realized. As a result, jitter of the signal output becomes smaller and an error rate at the time of reading can be reduced.

In the portion where the MR effect element 1 and the recording head 2 that are described above are not formed, the insulating layers 92, 93 are formed.

(Second Embodiment) FIG. 3 is a perspective view of a main section of the MR effect element 1 a viewed from a side of the ABS of the thin film head of the present embodiment. FIG. 4 is a partially enlarged perspective view of FIG. 3. The thin film magnetic head of the present embodiment is the same as the first embodiment shown in FIG. 1 except for a configuration of the MR effect element. The MR effect element 1a has the MR layered body 15 in which many layers are deposited as in the first embodiment, with the upper shield electrode layer 3a and the lower shield electrode layer 4a formed in a manner of sandwiching the MR layered body 15 in the perpendicular direction (layering direction) P relative to a film surface. Table 2 shows one example of a film configuration of the MR layered body 15. Table 2 shows layers from the exchange coupling transmitting layer 51 adjoining the lower shield electrode layer 4a toward the exchange coupling transmitting layer 59 adjoining the upper shield electrode layer 3a in order from bottom to top.

TABLE 2

| Film configuration | Composition | Film thickness (nm) |
| --- | --- | --- |
| Exchange coupling transmitting layer 59 | Ru | 0.8 |
| Gap adjusting layer 58 | CoFe | 1.0 |
| Exchange coupling transmitting layer 57 | Cu | 0.9 |
| Second magnetic layer 56 | CoFe | 4.0 |
| Spacer layer 55 | ZnO | 1.2 |
| First magnetic layer 54 | CoFe | 4.0 |
| Exchange coupling transmitting layer 53 | Cu | 0.9 |
| Gap adjusting layer 52 | CoFe | 1.0 |
| Exchange coupling transmitting layer 51 | Ru | 0.8 |

Referring to Tables 3 and 4, the MR layered body 15 includes a pair of upper and lower magnetic layers (a first magnetic layer 54 formed on the lower side in the deposition direction and a second magnetic layer 56 formed on the upper side in the deposition direction) whose magnetization directions change according to the external magnetic field. A spacer layer 55 made of ZnO is formed between the first and second magnetic layers 54, 56. An exchange coupling transmitting layer 51, a gap adjusting layer 52 and an exchange coupling transmitting layer 53 are formed between the first magnetic layer 54 and the lower shield electrode layer 4a. Similarly, an exchange coupling transmitting layer 57, a gap adjusting layer 58 and an exchange coupling transmitting layer 59 are formed between the second magnetic layer 56 and the upper shield electrode layer 3a. Exchange coupling transmitting layers 51, 59 are formed of ruthenium (Ru), gap adjusting layers 52, 58 are formed of CoFe, and the exchange coupling transmitting layer 53, 57 are formed of copper (Cu), respectively.

The upper shield electrode layer 3a and the lower shield electrode layer 4a are magnetized in an antiparallel direction to each other. Herein, antiparallel means that directions of the magnetic fields are in parallel and oriented in opposite directions. There are various methods to fix the magnetizing directions of the upper shield electrode layer 3a and lower shield electrode layer 4a in the antiparallel direction. In one embodiment, the upper shield electrode layer 3a and the lower shield electrode layer 4a are configured to have an elongate shape in the track width direction T so that these layers become single magnetic domains due to a shape anisotropy effect and that the magnetization directions of the layers are antiparallel to one another. In another embodiment, the antiferromagnetic layer is formed adjacent to the upper shield electrode layer 3a and the lower shield electrode layer 4a, and the magnetization directions of the upper shield electrode layer 3a and the lower shield electrode layer 4a are fixed using the antiferromagnetic coupling.

The first magnetic layer 54 makes a positive exchange coupling with the upper shield electrode layer 3a via the first exchange coupling transmitting layer 51, the first gap adjusting layer 52 and the first exchange coupling transmitting layer 53. As a result, as shown with arrows in FIGS. 3 and 4, the first magnetic layer 54 is applied a force to magnetize in the same direction as the lower shield electrode layer 4a. Similarly, the second magnetic layer 56 make a positive exchange coupling with the upper shield electrode layer 3a via the second exchange coupling transmitting layer 59, the second gap adjusting layer 58, and the second exchange coupling transmitting layer 57. As the result, as shown with arrows in FIGS. 3 and 4, the second magnetic layer 56 is applied a force to magnetize in the same direction as the upper shield electrode layer 3a. In this embodiment, the upper shield electrode layer 3a and the second magnetic layer 56, and the lower shield electrode layer 4a and the first magnetic layer 54 are magnetized in the same direction due to the exchange coupling transmitting layers 51, 53, 57, and 59. However, the layers can be easily magnetized in an opposite direction by changing the number and thickness of the exchange coupling transmitting layers. Using these techniques, it is not always necessary for the upper shield electrode layer 3a and the lower shield electrode layer 4a to be magnetized in antiparallel directions, and these layers can be magnetized in a parallel direction.

Figure 5:
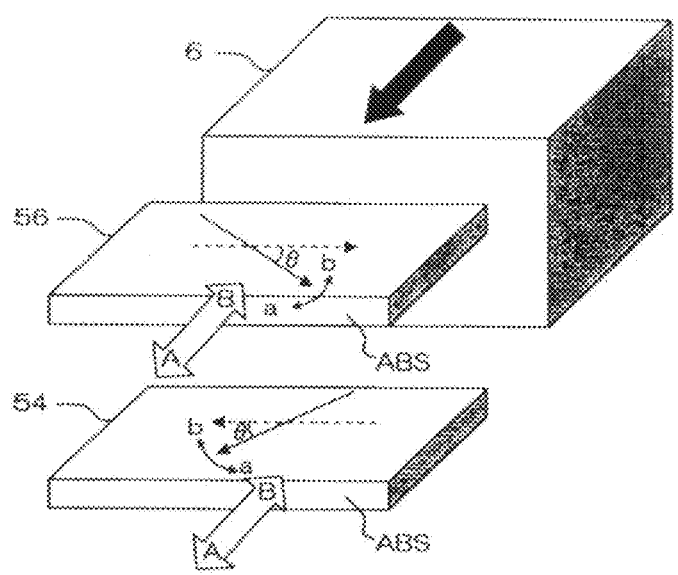
FIG. 5 is a schematic view showing a magnetizing of the first and second magnetic layers of the MR effect element shown in FIG. 3.

FIG. 5 is a pattern diagram showing the magnetization of the first and second magnetic layers. The bias magnetic field layer 6, viewed from the ABS S, is formed on the side of the rear surface of the MR layered body 15. The bias magnetic layer 6, as shown with a black arrow in the figure, is magnetized in a perpendicular direction relative to the ABS S. As a result, the first and second magnetic layers 54, 56 are applied a magnetic field in a perpendicular direction relative to the ABS S. As described above, the first and second magnetic layers 54, 56 make exchange couplings with the upper shield electrode layer 3a and the lower shield electrode layer 4a, and receive a bias magnetic field applied from the bias magnetic layer 6. As a result, as shown with solid arrows in FIG. 5, magnetic directions of the first and second magnetic layers 54, 56 rotate in a predetermined angle θ toward reverse directions relative to each other from the dashed lines, and are ideally intersected perpendicularly relative to each other.

When the external magnetic field is applied as shown with outline arrows in the figure in this condition, the magnetization directions of the first and second magnetic layers 54, 56 rotate toward reverse directions relative to each other corresponding to the external magnetic field. Specifically, when the external magnetic field is applied in the direction A in the figure, the magnetization directions of the first and second magnetic layers 54, 56 rotates toward the direction A in the figure, and when the external magnetic field is applied in the direction B in the figure, the magnetization directions of the first and second magnetic layers 54, 56 rotate toward the direction B in the figure. As described above, a relative angle formed with the magnetization directions of the first and second magnetic layers 54, 56 corresponding to the external magnetic field changes, and a resistance value of the sense current C changes based on the MR effect.

With this principle, the MR effect element 1a can detect a direction and intensity of the external magnetic field. As described above, the MR effect element 1a in this embodiment has a pair of magnetic films 54, 56 whose magnetic directions are changed according to the external magnetic field and the spacer layer 55 sandwiched by these films. The MR effect element 1a is different from the first embodiment because, in the second embodiment, the magnetization directions of a pair of the magnetic films 54, 56 both rotate according to the external magnetic field. However, the MR effect element 1a has identical features to the first embodiment; that is, it includes a ZnO layer as the spacer layer 55 and functions as an MR effect element of a CPP structure.

The thin film magnetic head described above is manufactured according a method described below. In the case of the thin film magnetic head of the first embodiment, a lower shield electrode layer 4 is formed on a substrate (not shown) made of ceramic materials as altic ($Al_2O_3$/TiC), etc. via an insulting layer (not shown). Next, each of layers is formed by sputtering sequentially from the buffer layer 31 through the cap layer 36. In a case of making an MR effect element of a top-type, a magnetic free layer is formed first. A multi-layer film made as described above is patterned (or formed in a predetermined shape) in a column shape. After that, the hard bias film 12 is formed on the sides of the patterned multi-layer film, and an insulting layer is formed on the remaining parts. After that, as shown in FIG. 2, the upper shield electrode layer 3 is made, and the MR effect element is completed. When a writing head is formed, further, a writing magnetic pole layer and a coil are layered and the whole is covered with a protective film. Next, the substrate (wafer) is cut, lapped, and divided into a slider.

In the case of a thin film magnetic head of the second embodiment, first, a lower shield electrode layer 4a is formed on a substrate (not shown) made of ceramic materials as altic ($Al_2O_3$/TiC), etc. via an insulting layer (not shown). Next, each of the layers are formed by sputtering sequentially from the exchange coupling transmitting layer 51 through the exchange coupling transmitting layer 59. A multi-layer film made as described above is patterned (or formed) in a column shape. After that, the hard bias magnetic layer 6 is formed on a backside of the patterned multi-layer film, and the insulting layer is formed on the remaining parts. After that, the upper shield electrode layer 3a is made, and a magneto resistive effect element is completed. The following processes are identical to the first embodiment.

Figure 6:
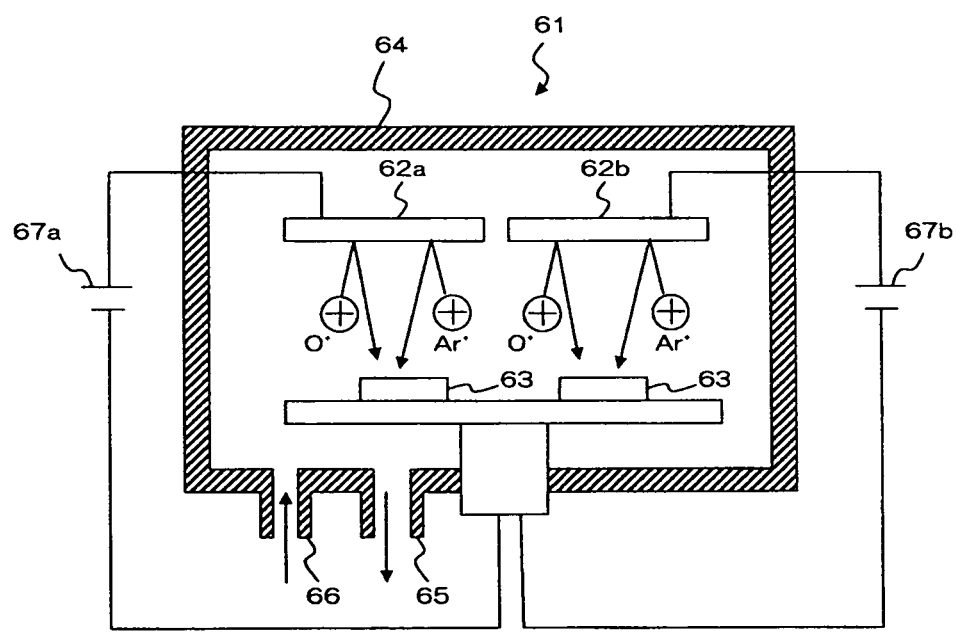
FIG. 6 is a conceptual diagram of a sputtering device used for forming a film of ZnO.

Herein, the method for forming a ZnO film constructing the spacer layer 34, 55 will be described in more detail. FIG. 6 is a conceptual diagram of a sputtering device used for forming the ZnO film. The sputtering device 61 has a chamber 64 defining a space where targets 62a and 62b can be arranged in a manner of facing a deposition object 63 like a wafer and etc. In the present embodiment, the sputtering device 61 can set at least two targets 62a and 62b in the chamber 64, and the number (the number of wafers) of the deposition objects 63 that are accommodated at (per time) is not limited. The number can be either a single wafer or plural wafers. "Facing arrangement (or arrangement in a manner of facing)" includes not only that the target and the deposition objects face one another in a strictly parallel manner about a common center line, but also that they may face one another in a parallel but slightly offset manner relative to the common center line. A vacuum pump (not shown) and a connectable end connection 65 are disposed in the chamber 64, and actuation of the vacuum pump reduces a pressure in the chamber 64 and creates vacuum atmosphere. Another end connection 66 that can introduce argon gas is disposed in the chamber 64. As described below, in the present embodiment, a mix gas of argon gas and oxygen is introduced into the chamber 64 from the end connection 66. The first and second direct current (DC) power devices 67a, 67b are disposed outside of the chamber 64. The first and second DC power devices 67a, 67b apply each of first and second DC voltages to spaces between the first target 62a and the deposition object 63, and the second target 62b and the deposition object 63, wherein the first and second targets 62a, 62b are set at negative potential and the deposition object 63 is set at positively potential.

(Step for introducing mix gas) In the chamber 64, the first target 62a made of ZnO and the second target 62b made of Zn are disposed. The chamber 64 also includes a substrate 63 having a right-below layer on which the ZnO film is formed. Since each of the layers constructing the MR layered body is formed by sputtering in general, the substrate 63 remains in the same chamber. The "right-below layer" means the magnetic pinned layer 33 in the first embodiment and the first magnetic layer 54 in the second embodiment. When any films other than the ZnO film are included in the spacer layer, for example, in the case of using the layered structure of Cu/ZnO/Cu described in the first embodiment, the "right-below layer" means the Cu layer on the lower side of a deposition direction, that is, the Cu layer on the substrate side. The first and second targets 62a and 62b are arranged opposite to the right-below layer (or in a manner of facing the right-below layer), being the magnetic pinned layer 33 in the first embodiment and the first magnetic layer 54 in the second embodiment.

Next, the mix gas of oxygen gas and argon gas is introduced into the chamber 64 whose pressure is reduced. As described below, a partial pressure of oxygen gas in the mix gas may be extremely small, and preferably it is no less than 2%. In the production of a thin film magnetic head having many films that are sequentially formed by sputtering, generally, more than one target is formed in the same chamber. When the partial pressure of oxygen gas is too high, alteration by oxidation of the targets other than ZnO and Zn is a concern. From this viewpoint, it is preferable to prevent forming films under high partial pressure of oxygen. Furthermore, when a partial pressure of oxygen gas is too high, the vacuum pump (cryopump) equipped in the sputtering device absorbs oxygen, resulting in a negative effect to the sputtering device. Therefore, the partial pressure of oxygen gas is preferred not to be relatively high.

(Depositing step) Next to the step for introducing the mix gas, each of the first and second DC application powers is applied to spaces between the first and second targets 62a, 62b, and the substrate 63, wherein the first and second targets 62a, 62b are set at negative potential and the substrate 63 is set at positive potential. As a result, plasma is formed in the chamber 64, and set at positive potential argon and oxygen ions collide with the first and second targets 62a, 62b that are set at negative potential so that Zn atoms and ZnO molecules are emitted. The Zn atoms and the ZnO molecules are deposited onto the right-below layer discussed above, and the ZnO film(s) is formed.

In this case, the first and second DC voltages, in other words DC application power, are controlled so that the percentage of Zn in the ZnO film that is deposited on the deposition surface is no less than 10%, the Zn being emitted from the second target 62b. A ratio of the applied current power and the deposition rate is not constant, and varies according to the target. The ratio of the first DC application power and the second DC application power in order to control the percentage of Zn 10% is not 9:1. In another embodiment described later, the ratio is 19:1. Furthermore, since the deposition rate can be set freely when the percentage of Zn is controlled, either one of the first DC application power and the second DC application power may be controlled, and also both of them may be controlled simultaneously or sequentially.

Figure 7:
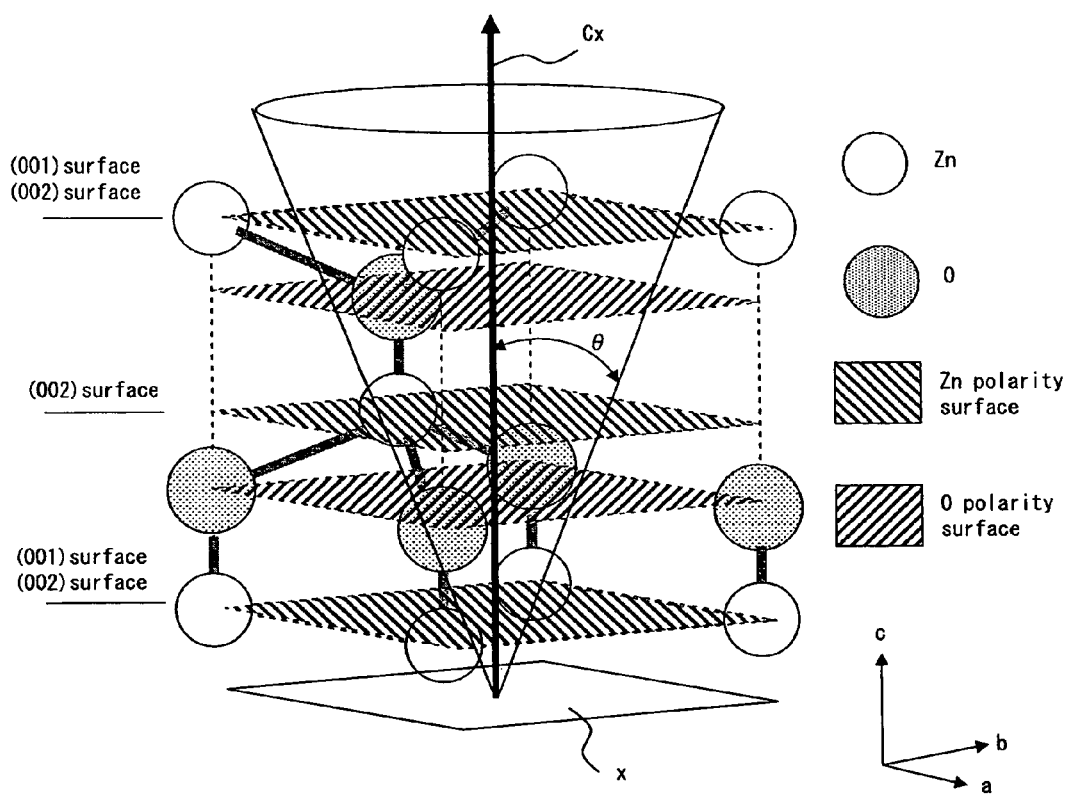
FIG. 7 is a schematic view showing a unit crystal lattice of ZnO.

FIG. 7 is a pattern diagram showing a unit crystal lattice of ZnO. In ZnO, these axes, a-axis, b-axis, and c-axis, are defined as shown in the figure. In the unit crystal lattice of ZnO, an upper surface and a lower surface that intersect vertically with the c-axis Cx are called the (001) surface. Meanwhile, in addition to the (001) surface, a (002) surface is a middle surface parallel to the (001) surface and intersects vertically the c-axis Cx, and divides a volume of the unit lattice into half. The (002) surface is a Zn polarity surface on which Zn atoms are arranged. A surface existing in the middle of the Zn polarity surface and on which oxygen atoms are arranged is referred to an oxygen polarity surface. When a ZnO film is formed by a conventional sputtering method, as described above, each one of these polarity surfaces appears on the outermost surface (the front most surface) due to the c-axis orientation. In other words, due to the c-axis orientation, the unit crystal lattice of ZnO has a strong tendency that each one of these polarity surfaces appears on the far-front surface. However, it is difficult to control a polarity surface appeared on a far-front surface.

On the other hand, the c-axis orientation can be restrained, and an amorphous structure or a crystal structure having an orientation other than the c-axis orientation are obtained by simultaneous sputtering in the mix gas of oxygen gas and argon gas using the first target made of ZnO and the second target made of Zn. As a result, in the obtained ZnO film, the c-axis Cx is inclined at angle θ (0°<≤90°) with respect to direction c that is perpendicular to the surface of the ZnO film. The Zn atom and the O atom coexist on an interface of the ZnO film and the adjacent layer. Conventionally, it is a concern that either a Zn polarity surface or a O polarity surface appears on a far-front surface of a ZnO film and that that is one reason of increasing a diversion of chip properties. However, it is realized that diversions of the MR rate and the output property are significantly decreased by restraining the c-axis orientation described above.

Conventionally, it has been known that a c-axis orientation of a ZnO film increases by decreasing a ratio of Zn ions (Zn+/ZnO+ ratio) to ZnO ions in plasma (see C. R. Aita et al., J. Apll. Phys., 51 (1980)). Aita et al. used only ZnO as a target, and tried to control the orientation by regulating a ratio of mixing of Ar/$O_2$ gas. The inventor of the present application realizes that a ratio of Zn and ZnO in plasma is increased and the c-axis orientation is controlled by simultaneously sputtering Zn and ZnO of raw materials.

The method for forming a ZnO film described above can be widely applied to applications other than a thin film magnetic head, when it is necessary to control c-axis orientation of a ZnO film.

Namely, the method for forming a ZnO film comprises at least the steps of:

(1) step for arranging the first target of ZnO, the second target of Zn, and the deposition object having the deposition surface, wherein the first and second targets are arranged to face the deposition surface in a chamber, and of de-pressuring the chamber;

(2) step for introducing a mix gas of oxygen gas and argon gas into the depressurized chamber;

(3) step for depositing a ZnO film on the deposition surface by applying each of first and second direct current (DC) application power to spaces between the first and second targets and the deposition object respectively after the mix gas introducing step, wherein the first and second targets are set at negative potential, and the deposition object is set at positive potential.

In these steps also, it is preferable that the depositing step controls at least one of the first or second DC voltages so that the percentage of Zn in the ZnO film deposited on the deposition surface may be no less than 10% wherein the Zn is emitted from the second target. And, in the step of introducing the mix gas, it is desirable to introduce the mix gas so that a partial pressure of oxygen gas in the mix gas is no less than 2%.

EXAMPLE 1

It is assured that a thin film having a flat surface of ZnO is formed and the c-axis orientation ((002) orientation) can be restrained by using the new technique of sputtering ZnO and Zn simultaneously in a mix gas of argon and oxygen, described above.

In the example, ZnO whose oxygen is deficit (or lost) is made by distributive adjustment of application power at a simultaneous sputtering. However, a similar effect is expected when in a composition of targets using for sputtering, another composition adjusted to a side of deficient oxygen is used.

A sample used for the evaluation is made by the processes below:

(1) One layer film of ZnO whose thickness is 50 mm (see FIG. 3 for detailed conditions of forming a film) is formed on a thermally-oxidized Si substrate.

(2) Heat treatment is carried out at 250° C. for 3 hours after forming the film, and samples 01-24 are made.

Table 3 shows film forming conditions of ZnO in example 1 and a percentage of oxygen in the simultaneous sputtering. A film of ZnO is formed by the simultaneous sputtering with a ZnO target and a Zn target, and electric power applied to each target is controlled. The application power applied to the ZnO and the Zn is 200(ZnO) and 0(Zn), 190(ZnO) and 10(Zn), and 180(ZnO) and 20(Zn) (unit W). The application power is calculated considering that speeds of film formation of ZnO and Zn are different. Further, it is speculated that each percentage of Zn occupied in the ZnO film is about 0, 10, 20%, the ZnO film is made by the simultaneous sputtering of ZnO and Zn. An Ar/$O_2$ flow ratio is ranked with eight levels of 0% to 80%, based on a percentage of 2. The ZnO films are formed in 24 types conditions (3×8). Additionally, the percentage of Zn is defined as x, where a of ZnO is described as ZnO (100−x)Zn x and the ZnO is made by the simultaneous sputtering of ZnO and Zn. Furthermore, since ZnO (100−x) Zn x can be described as Zn 100 O (100−x), the percentage of Zn can be described as a proportion of deficient oxygen. Additionally, unit lattice volumes of ZnO and Zn are respectively, 0.0477 and 0.0304 (nm$^3$). Since the number of Zn atoms included in the unit lattice is two for both, the volume percentage of Zn is 0.0304*x/(0.0477*(100−x)+0.0304*x) =0.0304x/(4.77−0.0173x) when it is expressed with the Zn percentage x. This formula means, for example, that a volume of Zn occupied in ZnO/Zn is actually approximately 6.6%.

TABLE 3

| | Percentage of Zn % | Percentage of oxygen in gas % | (002) Peak diffraction intensity a.u. |
|---|---|---|---|
| sample 01 | 0 | 0 | 1.00 |
| sample 02 | 0 | 2 | 0.93 |
| sample 03 | 0 | 5 | 0.88 |
| sample 04 | 0 | 10 | 0.81 |
| sample 05 | 0 | 20 | 0.62 |
| sample 06 | 0 | 30 | 0.55 |
| sample 07 | 0 | 50 | 0.07 |
| sample 08 | 0 | 80 | 0.01 |
| sample 09 | 10 | 0 | 0.87 |
| sample 10 | 10 | 2 | 0.49 |
| sample 11 | 10 | 5 | 0.09 |
| sample 12 | 10 | 10 | 0.04 |
| sample 13 | 10 | 20 | 0.01 |
| sample 14 | 10 | 30 | 0.01 |
| sample 15 | 10 | 50 | 0.01 |
| sample 16 | 10 | 80 | 0.01 |
| sample 17 | 20 | 0 | 0.71 |
| sample 18 | 20 | 2 | 0.45 |
| sample 19 | 20 | 5 | 0.08 |
| sample 20 | 20 | 10 | 0.05 |
| sample 21 | 20 | 20 | 0.03 |
| sample 22 | 20 | 30 | 0.01 |

TABLE 3-continued

|  | Percentage of Zn % | Percentage of oxygen in gas % | (002) Peak diffraction intensity a.u. |
|---|---|---|---|
| sample 23 | 20 | 50 | 0.01 |
| sample 24 | 20 | 80 | 0.01 |

Figure 8:
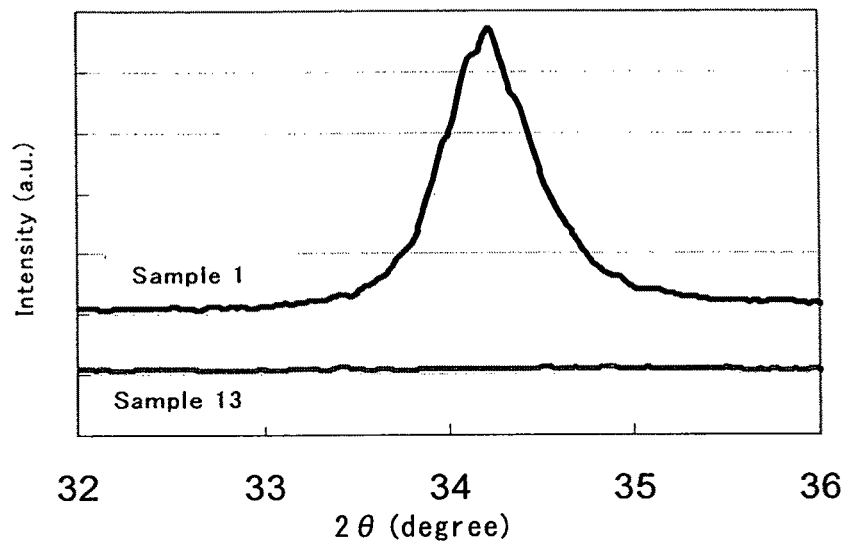
FIG. 8 is a comparison chart of a diffractive pattern of X-ray of sample 01 and sample 13.

Table 3 shows relative numbers of (002) peak diffraction intensities of ZnO, determined by the out-of-plane X-ray diffraction (XRD). The relative numbers are calculated referring to the sample 01 (the percentage of Zn 0%, the quantity of $O_2$ 0%) as the standard value. The out-of-plane XRD indicates that it is operated in the orthogonal direction on a surface of an object. With respect to ZnO, since the surface (001) and the surface (002) are equivalent, a diffraction peak of the surface (001) is not monitored by an extinction rule. Therefore, c-axis lengths are calculated by the diffraction peak of the surface (002). It is indicated that the larger the (002) peak diffraction intensity of ZnO, the more the c-axis is oriented. When the peak diffraction intensity is small, it is indicated that the c-axis orientation is out of order. In other words, it indicates, for example, amorphous status, or (100), (101) orientation status. As an example, FIG. 8 shows patterns of X-ray diffraction of sample 01 and sample 13. There is a (002) diffraction peak around at 2θ=34 degrees in sample 01. On the other hand, it is apparent that the diffraction peak substantially disappears in sample 13.

Figure 9:
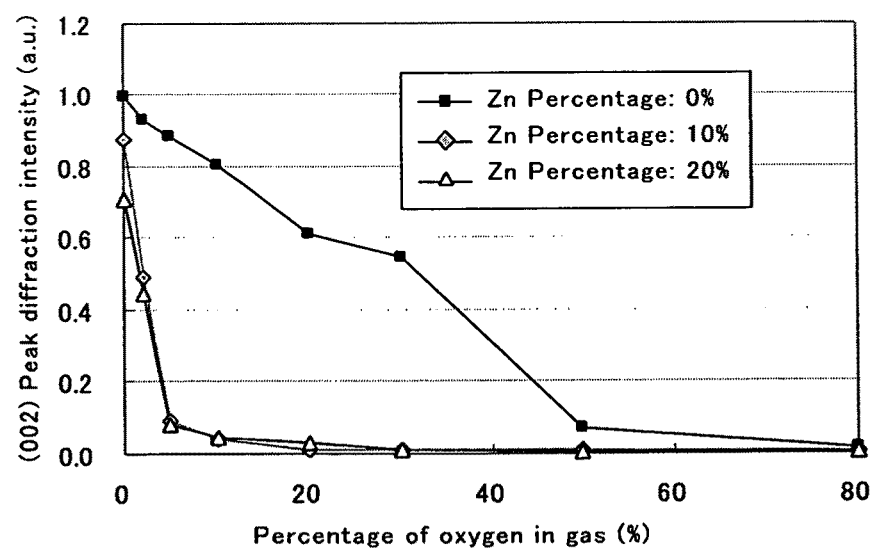
FIG. 9 is a graph showing a relationship between an oxygen percentage and (002) peak intensity by the percentage of Zn.

FIG. 9 shows a relationship of oxygen percentage and (002) peak intensity by percentages of Zn. When a film is formed in the condition of the percentage of Zn is no less than 10% and the oxygen percentage is no less than 2%, the (002) peak intensity is no more than half compared with the standard value.

EXAMPLE 2

Next, a magnetoresistive effect film (MR layered body) is made by the method described above, and the MR rate and resistance value are calculated.

A sample used for the evaluation is made in the order below:

(1) Foundation layer (NiCr, 4 nm), antiferromagnetic layer (IrMn, 5 nm), ferromagnetic layer 1 (CoFe, 3 nm/Ru 0.7 nm/, CoFe 3.5 nm), nonmagnetic intermediate layer (ZnO, 1.6 nm: see Table 4 for the detailed film forming condition), ferromagnetic layer 2 (CoFe, 4 nm), and cap layer (Ru, 2 nm) are formed in this respective order.

(2) Heat treatment is conducted in 250° C. for 3 hours after the film forming.

(3) By shaping the above-mentioned film in a column of 100×100 nm, by covering the side surface with an insulating layer ($Al_2O_3$) whose thickness is 20.0 nm, and by forming an electrode on the top, samples 25-48 are made. 216 elements are made for each sample.

As in example 1, the ZnO film is formed by the simultaneous sputtering with the ZnO target and the Zn target, and a power applied to each target is controlled in the same manner as the example 1. The MR rate and resistance value are calculated for each element, and the diversion (standard deviation) is calculated. Table 4 shows the results. As in Table 3, it shows relative numbers that are defined based on the sample 25 (Zn percentage 0%, $O_2$ percentage 0%) as the standard value.

TABLE 4

|  | Zn percentage % | Oxygen percentage in gas % | Standard deviation of resistance a.u. | Standard deviation of MR rate a.u. |
|---|---|---|---|---|
| sample 25 | 0 | 0 | 1.00 | 1.00 |
| sample 26 | 0 | 2 | 0.92 | 0.89 |
| sample 27 | 0 | 5 | 0.91 | 0.81 |
| sample 28 | 0 | 10 | 0.71 | 0.71 |
| sample 29 | 0 | 20 | 0.58 | 0.66 |
| sample 30 | 0 | 30 | 0.44 | 0.59 |
| sample 31 | 0 | 50 | 0.32 | 0.42 |
| sample 32 | 0 | 80 | 0.30 | 0.42 |
| sample 33 | 10 | 0 | 0.95 | 0.88 |
| sample 34 | 10 | 2 | 0.43 | 0.48 |
| sample 35 | 10 | 5 | 0.42 | 0.40 |
| sample 36 | 10 | 10 | 0.35 | 0.38 |
| sample 37 | 10 | 20 | 0.36 | 0.39 |
| sample 38 | 10 | 30 | 0.29 | 0.38 |
| sample 39 | 10 | 50 | 0.28 | 0.35 |
| sample 40 | 10 | 80 | 0.27 | 0.40 |
| sample 41 | 20 | 0 | 0.62 | 0.55 |
| sample 42 | 20 | 2 | 0.41 | 0.43 |
| sample 43 | 20 | 5 | 0.35 | 0.46 |
| sample 44 | 20 | 10 | 0.33 | 0.41 |
| sample 45 | 20 | 20 | 0.33 | 0.37 |
| sample 46 | 20 | 30 | 0.31 | 0.36 |
| sample 47 | 20 | 50 | 0.27 | 0.39 |
| sample 48 | 20 | 80 | 0.29 | 0.35 |

Figure 10:
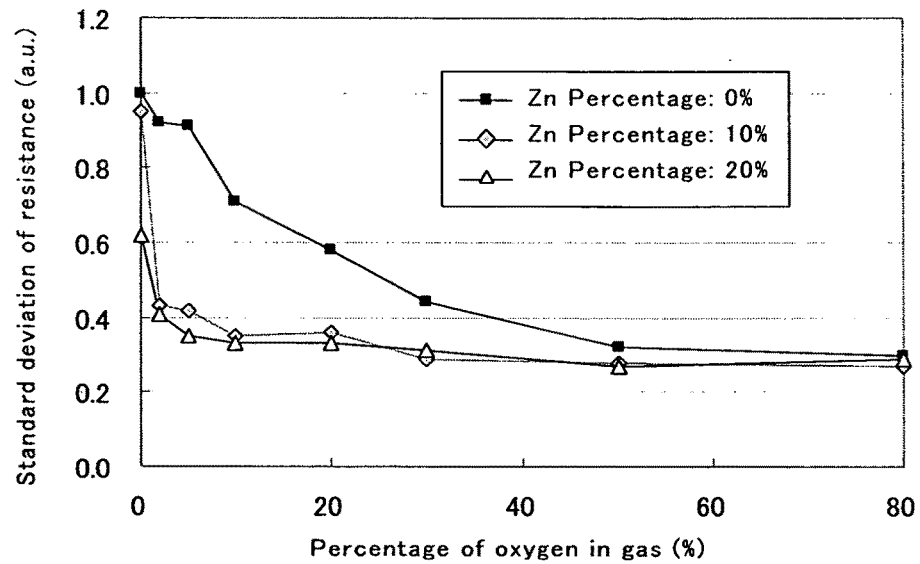
FIG. 10 is a graph showing the relationship between percentage of oxygen and a standard deviation of a resistance by percentages of Zn.
Figure 11:
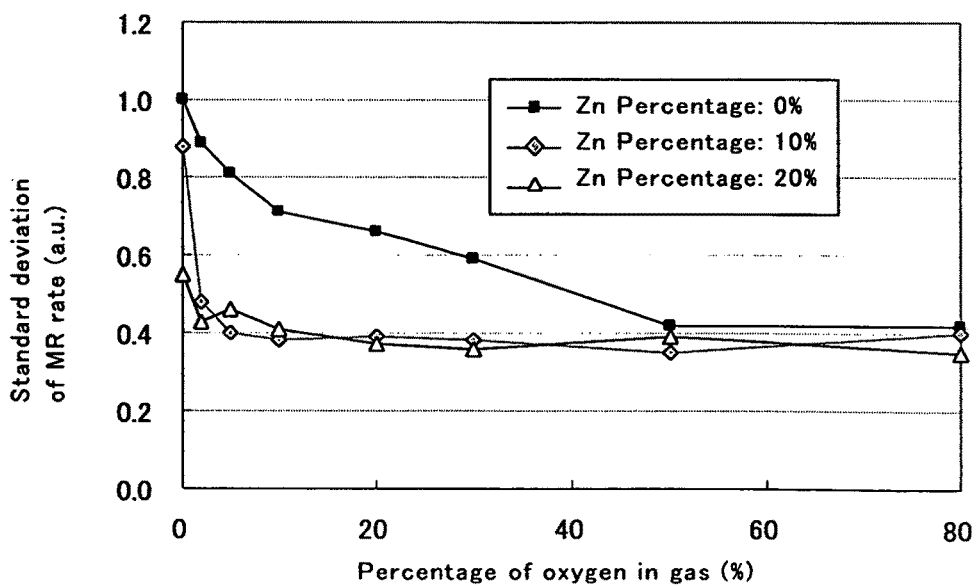
FIG. 11 is a graph showing the relationship between a percentage of oxygen and the standard deviation of the MR rate by percentages of Zn.

FIG. 10 shows a relationship between the oxygen percentage and the standard deviation of resistance, shown in Table 4, by the percentage of Zn. When a film is formed in the condition of the percentage of Zn is no less than 10% and the oxygen percentage is no less than 2%, the standard deviation of resistance is no more than half compared with the standard value. Simultaneously, FIG. 11 shows a relationship between the oxygen percentage and the standard deviation of resistance by the percentage of Zn. When a film is formed in the condition of the percentage of Zn is no less than 10% and the oxygen percentage is no less than 2%, the MR rate became not larger than half (equal or less than half).

Accordingly, the reduction of resistance and the reduction of diversion of the MR rate in the CPP element using ZnO as a nonmagnetic intermediate layer has a strong correlation with a decreasing of (002) peak intensity indicating c-axis orientation, and it is shown that the control over orientation is effective for improving of characteristics of elements.

Even if Zn percentage is 0%, it is possible to control an orientation by increasing the oxygen percentage in gas. However, since it is common that several targets are set in a single chamber in the process of manufacturing a magnetic head manufactured with various materials, when the oxygen percentage in the gas is high, an alteration by oxidation of targets other than ZnO and Zn is a concern. From this viewpoint, it is better to prevent forming a film under a high partial pressure of oxygen. Therefore, the present method is useful to control an orientation under a low partial pressure of oxygen.

Although some preferable embodiments of the present invention are presented and described in detail, it is necessary to understand that they can be variably modified and corrected without departing from the scope of the attached claims.

What we are claimed is:

1. A method of manufacturing a magnetoresistive (MR) effective element, wherein the MR effective element comprises a pair of magnetic layers and a nonmagnetic intermediate layer including a Zinc Oxide (ZnO) film that is sandwiched by the pair of the magnetic layers, a relative angle of magnetization directions of the pair of magnetic layers varies because at least the magnetization direction of one of the pair of the magnetic layers varies according to an external magnetic field, the method comprising:

step for introducing a mix gas of oxygen gas and argon gas into a depressurized chamber, wherein a first target of ZnO, a second target of Zn and a substrate having a right-below layer on which a ZnO film is to be formed are disposed in the chamber, the first and second targets are configured to face the right-below layer;

step for depositing the ZnO film on the right-below layer by applying a first direct current (DC) application power between the first target and the substrate and by applying second direct current (DC) application power between the second target and the substrate after the mix gas introducing step, wherein the first and second DC application power are independently applied, and the first and second targets are set at negative potential, and the substrate is set at positive potential, wherein the depositing step comprises controlling at least one of the first and second DC application power so that a percentage of the Zn, which is emitted from the second target, in the ZnO film deposited on the deposition surface is no less than 10%, and wherein a c-axis of the ZnO film is angled with respect to a direction perpendicular to a surface of the ZnO film by simultaneous sputtering using the first target of ZnO and the second target of Zn.

2. The method of manufacturing the MR effective element of claim 1, wherein the mix gas in the step of introducing includes a partial pressure of oxygen gas in the mix gas no less than 2%.

3. A method of forming a ZnO film, comprising:

step for arranging a first target of ZnO, a second target of Zn, and a deposition object having a deposition surface, wherein the first and second targets are arranged to face the deposition surface in a depressurized chamber;

step for introducing a mix gas of oxygen gas and argon gas into the depressurized chamber;

step for depositing a ZnO film on the deposition surface by applying first direct current (DC) application power between the first target and the deposition object and by applying second direct current (DC) application power between the second target and the deposition object after the mix gas introducing step, wherein the first and second DC application power are independently applied, and the first and second targets are set at negative potential, and the deposition object is set at positive potential, wherein the depositing step comprises controlling at least one of the first and second DC application power so that a percentage of the Zn, which is emitted from the second target, in the ZnO film deposited on the deposition surface is no less than 10%, and wherein a c-axis of the ZnO film is angled with respect to a direction perpendicular to a surface of the ZnO film by simultaneous sputtering using the first target of ZnO and the second target of Zn.

4. The method of forming the ZnO film of claim 3, wherein the mix gas in the step of introducing includes a partial pressure of oxygen gas in the mix gas no less than 2%.

5. The method of claim 1, wherein the first DC application power is different from the second DC application power.

6. The method of claim 3, wherein the first DC application power is different from the second DC application power.

* * * * *